United States Patent
Kim et al.

(10) Patent No.: US 12,211,718 B2
(45) Date of Patent: Jan. 28, 2025

(54) METHODS AND SYSTEMS OF IMAGE BASED ROBOT ALIGNMENT

(71) Applicant: GlobalWafers Co., Ltd., Hsinchu (TW)

(72) Inventors: TaeHyeong Kim, PyeongTeak (KR); JaeKoo Kang, Asan (KR); Soon Sung Park, Cheonan (KR)

(73) Assignee: GlobalWafers Co., Ltd., Hsinchu (TW)

( * ) Notice: Subject to any disclaimer, the term of this patent is extended or adjusted under 35 U.S.C. 154(b) by 356 days.

(21) Appl. No.: 17/658,360

(22) Filed: Apr. 7, 2022

(65) Prior Publication Data

US 2022/0351995 A1    Nov. 3, 2022

Related U.S. Application Data

(60) Provisional application No. 63/201,435, filed on Apr. 29, 2021.

(51) Int. Cl.
*H01L 21/67*    (2006.01)
*B25J 9/16*     (2006.01)
(Continued)

(52) U.S. Cl.
CPC ...... *H01L 21/67259* (2013.01); *B25J 9/1697* (2013.01); *B25J 19/025* (2013.01);
(Continued)

(58) Field of Classification Search
CPC ..... B25J 9/1697; G06V 10/25; G06V 10/507; G06V 10/751; H01L 21/681
See application file for complete search history.

(56) References Cited

U.S. PATENT DOCUMENTS

| | | | |
|---|---|---|---|
| 5,083,073 A | * | 1/1992 | Kato ............. B25J 9/1697 700/254 |
| 7,233,841 B2 | | 6/2007 | Sadighi et al. |

(Continued)

FOREIGN PATENT DOCUMENTS

| | | | | |
|---|---|---|---|---|
| CN | 108015762 A | * | 5/2018 | ............ B25J 9/1692 |
| CN | 108015762 B | | 1/2021 | |

(Continued)

OTHER PUBLICATIONS

International Search Report and Written Opinion issued for International Application No. PCT/KR2022/006164, dated Aug. 8, 2022 (11 pages).

*Primary Examiner* — Ted W Barnes
(74) *Attorney, Agent, or Firm* — Armstrong Teasdale LLP

(57) ABSTRACT

A system for monitoring alignment of a second component relative to a first component includes a camera, and a controller including a processor and a nontransitory memory. The controller is configured to receive a first captured image from the camera when the second component is in a predetermined position relative to the first component, receive a selection of a region of interest (ROI) in the first captured image, identify a visible feature of the second component within the ROI of the first captured image, receive captured images from the camera during a subsequent operation, identify a second captured image when the second component is expected to be in the predetermined position relative to the first component, and determine if the second component is in the predetermined position relative to the first component based on the second captured image and the identified visible feature of the first captured image.

20 Claims, 4 Drawing Sheets

(51) Int. Cl.
    *B25J 19/02*           (2006.01)
    *G06V 10/25*          (2022.01)
    *G06V 10/50*          (2022.01)
    *G06V 10/75*          (2022.01)
    *H01L 21/68*          (2006.01)

(52) U.S. Cl.
    CPC ............ *G06V 10/25* (2022.01); *G06V 10/507* (2022.01); *G06V 10/751* (2022.01); *H01L 21/681* (2013.01)

(56) References Cited

U.S. PATENT DOCUMENTS

| | | | |
|---|---|---|---|
| 8,260,461 B2 | 9/2012 | Krishnasamy et al. | |
| 11,274,929 B1* | 3/2022 | Afrouzi | G06T 7/62 |
| 11,764,093 B2* | 9/2023 | Krupyshev | H01L 21/67748 |
| | | | 700/259 |
| 2003/0202092 A1* | 10/2003 | Sadighi | B25J 9/1697 |
| | | | 348/87 |
| 2009/0062960 A1* | 3/2009 | Krishnasamy | B25J 9/1692 |
| | | | 700/258 |
| 2009/0204368 A1* | 8/2009 | Bickel | G05B 23/0272 |
| | | | 702/179 |
| 2013/0325179 A1* | 12/2013 | Liao | B25J 9/1697 |
| | | | 700/254 |
| 2019/0237351 A1* | 8/2019 | Krupyshev | H01L 21/67259 |
| 2021/0043484 A1* | 2/2021 | Moura | G06F 18/22 |
| 2021/0185236 A1* | 6/2021 | Hashimoto | H04N 23/6811 |
| 2021/0375657 A1* | 12/2021 | Krupyshev | H01L 21/67754 |
| 2022/0303460 A1* | 9/2022 | Duffy | H04N 23/635 |

FOREIGN PATENT DOCUMENTS

| | | | | | |
|---|---|---|---|---|---|
| KR | 10-2009-0023313 A | | 3/2009 | | |
| KR | 10-2012-0044998 A | | 5/2012 | | |
| WO | 2002019394 A1 | | 3/2002 | | |
| WO | WO-0219394 A1 | * | 3/2002 | ........... | H01L 21/681 |
| WO | WO-2021022029 A1 | * | 2/2021 | ............. | B25J 13/08 |

\* cited by examiner

METHODS AND SYSTEMS OF IMAGE BASED ROBOT ALIGNMENT

CROSS-REFERENCE TO RELATED APPLICATIONS

This application claims priority to U.S. Provisional Patent Application No. 63/201,435 filed Apr. 29, 2021, the entire disclosure of which is hereby incorporated by reference in its entirety.

FIELD

This disclosure generally relates to alignment of robotic systems, and more specifically, to methods and systems of image based robot alignment.

BACKGROUND

Robotic systems are frequently used in a variety of industries, such as product manufacturing, product processing, warehousing, and the like. For example, robotic systems are sometimes used in one or more stages of semiconductor crystal manufacturing and/or semiconductor wafer production. In one example, a wafer handling robot controls the position of a wafer in a production process by using servo motors. The position of the wafer occasionally deviates from the originally set position due to failures of hardware or environment, such as wear or failure related to a bearing, a brake, a winding, demagnetization of magnets, a rotor banding, contamination, electrical noise, electrostatic discharge, age and fatigue of electronic components, and the like.

In at least some known systems for wafer manufacturing, slip monitoring takes a relatively long time before slip (i.e., misalignment) is detected through feedback from a laser scattering inspection tool or defect etching. Because of this delay, many wafers (possibly hundreds of wafers) may be affected by the misalignment before the slip is detected.

This background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

BRIEF SUMMARY

One aspect of this disclosure is a system for monitoring alignment of a second component relative to a first component. The system includes a camera positioned in fixed relationship to the first component and operable to capture images of the first component and the second component during an operation of the second component, and a controller including a processor and a nontransitory memory storing instructions executed by the processor to configure the controller. The controller is configured to receive a first captured image from the camera when the second component is in a predetermined position relative to the first component, receive a selection of a region of interest (ROI) in the first captured image including at least a portion of the first component and at least a portion of the second component, identify a visible feature of the second component within the ROI of the first captured image, receive captured images from the camera during a subsequent operation, identify a second captured image from the received captured images during the subsequent operation when the second component is expected to be in the predetermined position relative to the first component, and determine if the second component is in the predetermined position relative to the first component based on the second captured image and the identified visible feature of the second component within the ROI of the first captured image.

Another aspect is a method for monitoring alignment of a second component relative to a first component. The method includes capturing a first image when the second component is in a predetermined position relative to the first component using a camera positioned in fixed relationship to the first component and operable to capture images of the first component and the second component during an operation of the second component, receiving a selection of a region of interest (ROI) in the first captured image including at least a portion of the first component and at least a portion of the second component, identifying a visible feature of the second component within the ROI of the first captured image, receiving captured images from the camera during a subsequent operation, identifying a second captured image from the received captured images during the subsequent operation when the second component is expected to be in the predetermined position relative to the first component, and determining if the second component is in the predetermined position relative to the first component based on the second captured image and the identified visible feature of the second component within the ROI of the first captured image.

Various refinements exist of the features noted in relation to the above-mentioned aspect. Further features may also be incorporated in the above-mentioned aspect as well. These refinements and additional features may exist individually or in any combination. For instance, various features discussed below in relation to any of the illustrated embodiments may be incorporated into the above-described aspect, alone or in any combination.

BRIEF DESCRIPTION OF THE DRAWINGS

Like reference symbols in the various drawings indicate like elements.

DETAILED DESCRIPTION

This disclosure generally relates to alignment of robotic systems, and more specifically, to methods and systems of image based robot alignment. Aspects of this disclosure will be described with reference to a semiconductor wafer handling robot and a semiconductor wafer processing device, but these aspects may be applied to alignment of any other robotic system.

Figure 1:
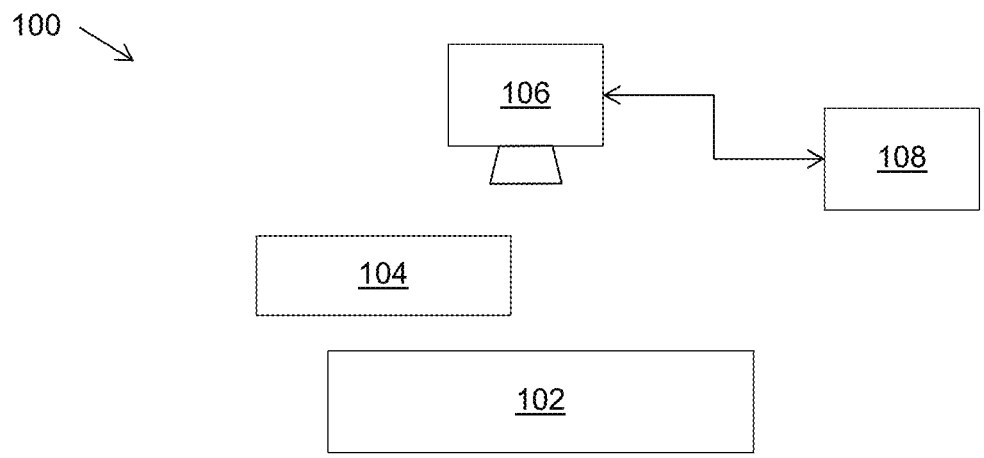
FIG. 1 is a block diagram of an example system for monitoring alignment of a first component and a second component.

FIG. 1 is a simplified block diagram of an example system 100 for monitoring alignment of a first component 102 and a second component 104. More specifically, the system monitors alignment of the second component 104 relative to the first component 102 during an operation of the second component. In the example embodiment, the first component 102 is a semiconductor wafer processing device, and the second component 104 is a semiconductor wafer handling robot. The semiconductor wafer handling robot retrieves a semiconductor wafer (not shown in FIG. 1) and positions the semiconductor wafer in the semiconductor wafer processing device to allow the semiconductor wafer processing device to perform a process on the wafer. The process may be, for example, an annealing process, an etching process, a polishing process, or any other semiconductor wafer process. At least a portion of the second component 104 is moveable relative to the first component 102. For example, the second component 104 may include an arm that holds the semiconductor wafer and moves relative to the first component 102 to move the wafer into the first component 102.

A camera 106 is positioned in fixed relationship to the first component 102 and is operable to capture images of the first component 102 and the second component 104 during operation of the second component 104. The camera 106 is a visible light camera capturing visible light images of at least a portion of the first component 102 and the second component 104 during the operation. In other embodiments, the camera 106 may be an infrared camera or any other suitable imaging device. In some embodiments, the camera 106 is a video camera and the images captured by the camera 106 are the individual frames of the video captured by the video camera. The camera 106 is positioned relative to the first component to capture an image of at least part of each of the first component 102 and the second component 104 when the second component 104 is in a predetermined position relative to the first component 102. The predetermined position is the position of the second component 104 relative to the first component 102 at a certain step of the operation. For example, when used in semiconductor wafer processing, the predetermined position may be the position of the semiconductor wafer handling robot (second component 104) when stops to deposit a semiconductor wafer in the semiconductor wafer processing device (first component 102).

A controller 108 is communicatively coupled to the camera 106 to receive images captured by the camera 106 and to control the camera 106, such as to adjust the camera settings, to instruct the camera 106 when to capture an image, and the like.

Figure 2:
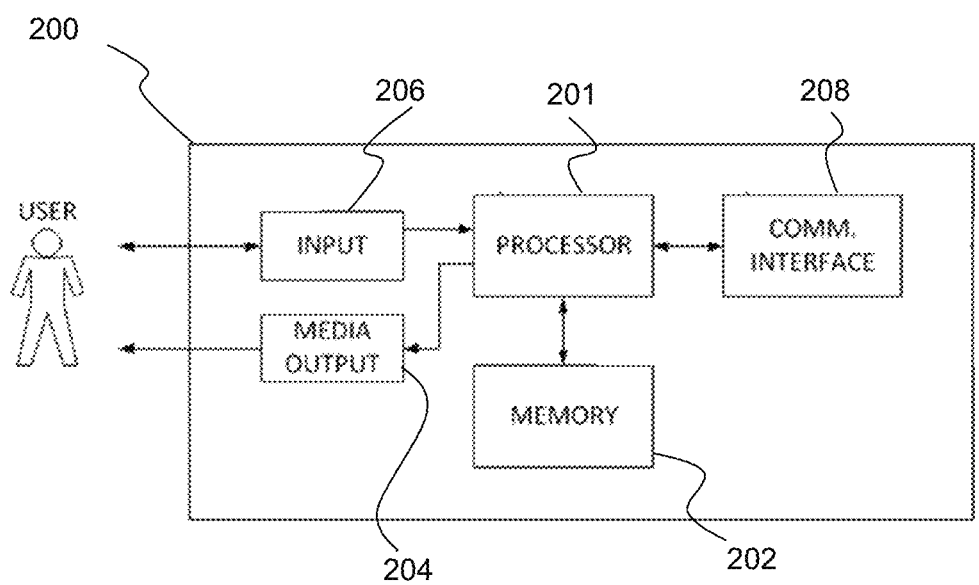
FIG. 2 is a block diagram of an example computing device for use in the system shown in FIG. 1.

FIG. 2 is a block diagram of an example computing device 200 that may be used as, or included as part of, the controller 108. The computing device 200 includes a processor 201, a memory 202, a media output component 204, an input device 206, and a communications interface 208. Other embodiments include different components, additional components, and/or do not include all components shown in FIG. 2.

The processor 201 is configured for executing instructions. In some embodiments, executable instructions are stored in the memory 202. The processor 201 may include one or more processing units (e.g., in a multi-core configuration). The term processor, as used herein, refers to central processing units, microprocessors, microcontrollers, reduced instruction set circuits (RISC), application specific integrated circuits (ASIC), a programmable logic circuit (PLC), and any other circuit or processor capable of executing the functions described herein. The above are examples only, and are thus not intended to limit in any way the definition and/or meaning of the term "processor."

The memory 202 stores non-transitory, computer-readable instructions for performance of the techniques described herein. Such instructions, when executed by the processor 201, cause the processor 201 to perform at least a portion of the methods described herein. That is, the instructions stored in the memory 202 configure the controller 108 to perform the methods described herein. In some embodiments, the memory 202 stores computer-readable instructions for providing a user interface to the user via media output component 204 and, receiving and processing input from input device 206. The memory 202 may include, but is not limited to, random access memory (RAM) such as dynamic RAM (DRAM) or static RAM (SRAM), read-only memory (ROM), erasable programmable read-only memory (EPROM), electrically erasable programmable read-only memory (EEPROM), and non-volatile RAM (NVRAM). Although illustrated as separate from the processor 201, in some embodiments the memory 202 is combined with the processor 201, such as in a microcontroller or microprocessor, but may still be referred to separately. The above memory types are example only, and are thus not limiting as to the types of memory usable for storage of a computer program.

The media output component 204 is configured for presenting information to a user (e.g., an operator of the system). The media output component 204 is any component capable of conveying information to the user. In some embodiments, the media output component 204 includes an output adapter such as a video adapter and/or an audio adapter. The output adapter is operatively connected to the processor 201 and operatively connectable to an output device such as a display device (e.g., a liquid crystal display (LCD), light emitting diode (LED) display, organic light emitting diode (OLED) display, cathode ray tube (CRT), "electronic ink" display, one or more light emitting diodes (LEDs)) or an audio output device (e.g., a speaker or headphones).

The computing device 200 includes, or is connected to, the input device 206 for receiving input from the user. The input device 206 is any device that permits the computing device 200 to receive analog and/or digital commands, instructions, or other inputs from the user, including visual, audio, touch, button presses, stylus taps, etc. The input device 206 may include, for example, a variable resistor, an input dial, a keyboard/keypad, a pointing device, a mouse, a stylus, a touch sensitive panel (e.g., a touch pad or a touch screen), a gyroscope, an accelerometer, a position detector, an audio input device, or any combination thereof. A single component such as a touch screen may function as both an output device of the media output component 204 and the input device 206.

The communication interface 208 enables the computing device 200 to communicate with remote devices and systems, such as the camera 106, remote sensors, remote databases, remote computing devices, and the like, and may include more than one communication interface for interacting with more than one remote device or system. The communication interfaces may be wired or wireless communications interfaces that permit the computing device 200 to communicate with the remote devices and systems directly or via a network. Wireless communication interfaces may include a radio frequency (RF) transceiver, a Bluetooth® adapter, a Wi-Fi transceiver, a ZigBee® transceiver, a near field communication (NFC) transceiver, an infrared (IR) transceiver, and/or any other device and communication protocol for wireless communication. (Bluetooth is a registered trademark of Bluetooth Special Interest Group of Kirkland, Washington; ZigBee is a registered trademark of the ZigBee Alliance of San Ramon, California.) Wired communication interfaces may use any suitable wired communication protocol for direct communication including, without limitation, USB, RS232, I2C, SPI, analog, and proprietary I/O protocols. In some embodiments, the wired communication interfaces include a wired network adapter allowing the computing device 200 to be coupled to a network, such as the Internet, a local area network (LAN), a wide area network (WAN), a mesh network, and/or any other network to communicate with remote devices and systems via the network.

The computer systems discussed herein may include additional, less, or alternate functionality, including that discussed elsewhere herein. The computer systems discussed herein may include or be implemented via computer-executable instructions stored on non-transitory computer-readable media or medium.

Figure 3:
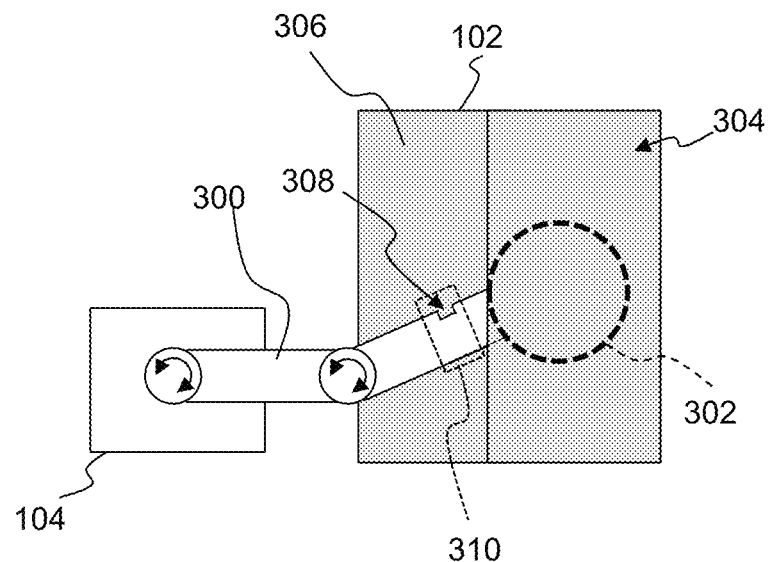
FIG. 3 is a top view of a portion of the system shown in FIG. 1.

FIG. 3 is a view of the system 100 from above the system 100, for example as seen from the location of the camera 106. The controller 108 and the camera 106 are not shown in FIG. 3. As seen in FIG. 3, the example second component 104 includes a moveable arm 300 holding a wafer 302. The second component 104 is placing the wafer 302 within a chamber 304 of the first component 102. The arm 300 extends over a basement portion 306 of the first component and into the chamber 304. In the example embodiment, the arm 300 includes a distinct visible feature that is a notch 308 through which part of the first component 102 is visible from the viewpoint of the camera 106. The visible feature may be any visible feature that can be identified by the controller 108. In other embodiments, the arm 300 includes a different visible feature (such as a protrusion, a through-hole, an engraving, or the like) or includes an added-on distinct visible feature (such as a distinctly colored or shaped sticker/mark, a QR code, or the like).

The camera 106 captures images of an image area 310. The memory 202 stores instructions executed by the processor 201 to configure the controller 108 to receive a first captured image (of image area 310) from the camera 106 when the second component 104 is in the predetermined position relative to the first component 102. This first image is captured when the second component 104 is known to be in the predetermined position. For example, the user may position the second component 104 in the predetermined position or make adjustments to the position of the second component 104 to place it in the predetermined position. This first image is thus an image of the correct predetermined position, such as the position that properly aligns a wafer for processing by the first component 102.

Figure 4:
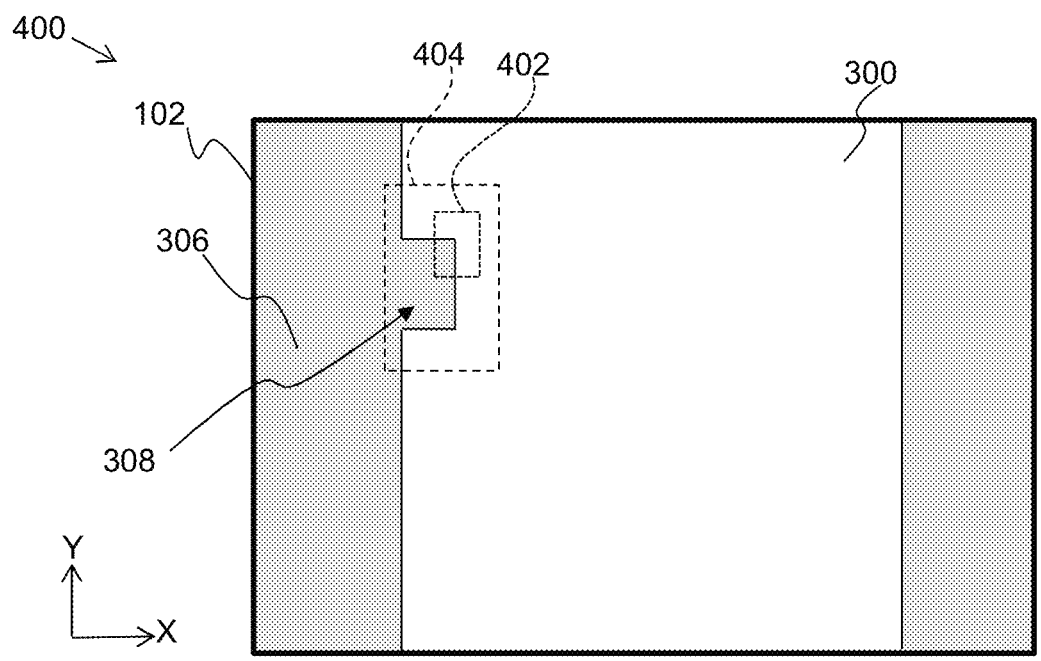
FIG. 4 is an example image of a portion of the first component and the second component captured by the camera of the system shown in FIG. 1.

FIG. 4 is an example image 400 of the image area 310. As can be seen, the basement portion 306 is different color (or a darker color) than the arm 300. The notch 308 in the arm 300, through which part of the basement portion 306 may be seen, is a visibly distinct feature in the image 400.

The controller 108 receives a selection of a region of interest (ROI) 402 in the first captured image 400. In the example embodiment, the ROI 402 includes a portion of the first component 102 and a portion of the second component 104. Alternatively, the ROI may include only a portion of the second component 104 (e.g., when the visible feature is a sticker surrounded completely by the arm 300). The ROI 402 may be selected manually by a user, such as by using the input device 106. In other embodiments, the ROI 402 is selected by the controller 108, such as by performing object detection and recognition on the image to identify the first component 102 and the second component 104 and/or the visible feature.

Figure 5:
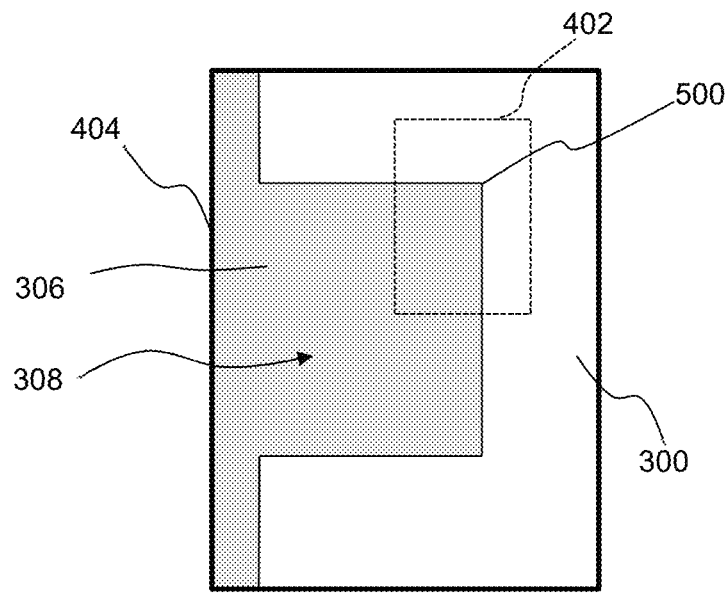
FIG. 5 is a close-up view of a portion of the image shown in FIG. 4.

FIG. 5 is a close-up view of the portion 404 in the image 400. The controller 108 is configured to identify a visible feature (e.g., the notch 308) of the second component 104 within the ROI 402 of the first captured image. In this embodiment, the controller 108 specifically identifies a corner 500 of the notch 308 within the ROI 402. In the example embodiment, the controller 108 identifies the corner 500 the first image 400 based on intensity values of pixels within the first image 400. That is, the basement portion 306 is identified in the image 400 by its darker color, and the arm 300 is identified by its lighter color (and differing intensity values) than the darker colored basement portion 306. The intersection imaginary lines marking the transitions between the basement portion 306 in the ROI 402 of the image 400 and the arm 300 in the ROI 402 of the image 400 (as determined from the intensity values) is the corner 500. In other embodiments, the controller 108 identifies the visible feature by receiving a selection of the visible feature from a user input.

Once the visible feature (e.g., corner 500) is identified, the controller 108 determine first coordinates of the identified visible feature of the second component within the ROI of the first captured image 400. The coordinates are the X-Y coordinates (as identified in FIG. 4) of the point at which the visible feature is located within the image 400. The X-Y coordinates may be, for example, determined by the location of the central pixel in the visible feature in the image 400. The controller 108 then stores the first coordinates in the memory. The controller 108 also determines the coordinates of the ROI 402 and stores the ROI coordinates in the memory 202. The ROI coordinates may be two coordinates, such as the coordinates of diagonally opposite corners, a single coordinate of one corner along with the dimensions and direction of the ROI 402 relative to that corner, or any other suitable coordinate or coordinates that identify the location of the ROI 402.

Because the camera 106 is fixed in relation to the first component 102 and only captures images of the same image area 310, any time the arm 300 is in the predetermined position, the visible feature should be in the same location (i.e., at the same X-Y coordinates) within a captured image. Thus, the first coordinates may be used to determine if the arm 400 is in the predetermined position during subsequent operations.

Thus, the controller 108 is configured to receive captured images from the camera 106 during a subsequent operation. The controller identifies a second captured image from the received captured images during the subsequent operation when the second component 104 is expected to be in the predetermined position relative to the first component 102. The time when the second component 104 is expected to be in the predetermined position relative to the first component 102 may be determined by the instructions for controlling the second component 104. For example, if the controller 108 also controls the second component 104, when the controller 108 knows from the instructions and/or from communication from the second component 104 that the second component 104 is believed to be at the predetermined location. That is, when the second component is at the step in the process at which the second component 104 should be at the predetermined location, the controller 108 knows that the second component 104 should be at the predetermined location and the image captured at this time is used as the second captured image.

Figure 6:
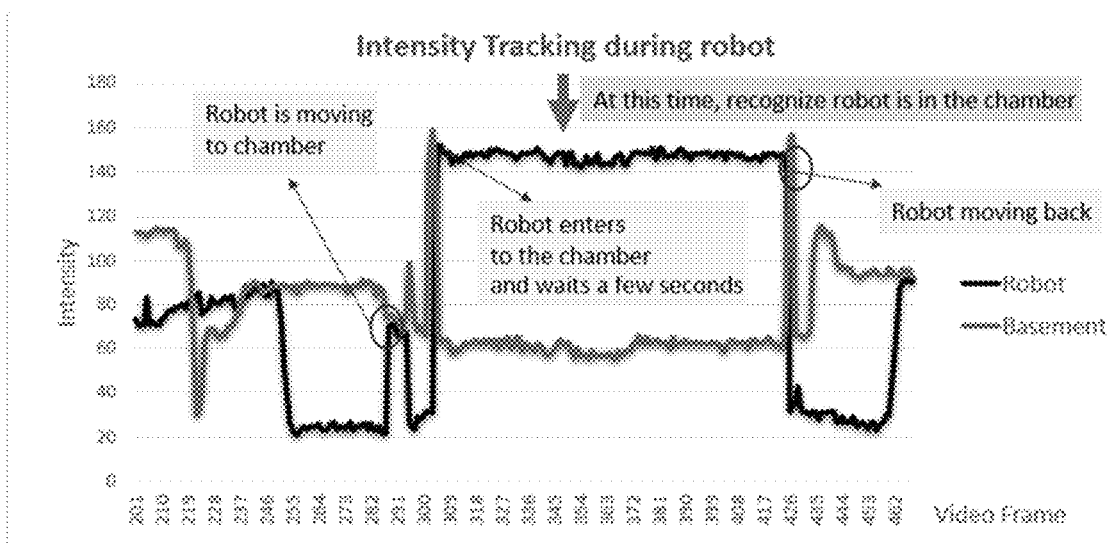
FIG. 6 is a graph of image intensities over a series of images for use in detecting when the second component shown in FIG. 1 is in a predetermined position relative to the first component.

In other embodiments, the controller 108 determines that the second component 104 is expected to be in the predetermined position based on analysis of the captured images. For example, FIG. 6 is a graph of image intensity of two points in images captured by the camera over time (or more specifically over a sequence of video frames when the camera 106 is a video camera). The two points are selected so that one point in is a point on the first component 102 in the image and one point is a point on the second component 104 in the image, when the second component 104 is in the predetermined position. For example, the upper left corner and the lower left corner of the ROI 402 shown in FIGS. 4 and 5 may be used as the two points. As noted above, in the example, the basement portion 306 is darker than the arm 300. Thus, when the arm 300 is not in the predetermined position, both points will have a relatively low intensity because both points in the image will be points of the basement portion. When the arm 300 is moving into position, the intensity of the points seen in the image of may vary as what is located at the two points varies. When the arm 300 is in position, it will stop for a period of time to place the wafer in the first component 102, and one point will be on the basement (and have a low intensity) and one point will be on the arm (and have a high intensity). Thus, when the intensity of the point associated with the arm 300 is relatively high and stable for a period of time, the arm 300 is determined to be in position, and the captured image from this time is used as the second captured image. In still other embodiments, the controller 108 determines that the second component 104 is expected to be in the predetermined position by locating and tracking the visible feature through multiple captured images. When the visible feature is within the ROI 402 and has not moved for a period of time, the controller 108 determines that the second component 104 is expected to be in the predetermined position, and uses the captured image from that time as the second captured image.

The controller 108 identifies the visible feature of the second component 104 in the second captured image. In the example embodiment in which the visible feature is the corner 500 of the notch 308, a FAST (Features from Accelerated Segment Test) algorithm is used. The FAST algorithm detects any corners in ROI so the important thing is to give a clear difference in pixel intensity around the corner. The number of corners detected is dependent on the threshold in the function of FAST. The format of FAST is FAST(InputArray image, std::vector<KeyPoint>& keypoints, int threshold, bool nomaxSuppression=true). As the threshold goes lower, the number of corners detected increases. The appropriate threshold for every image to return only one corner may be determined by looping the threshold from 200 to 1.

Although the example embodiment uses a corner, any point can be used as reference as long as it has different pixel intensity in the ROI 402. For example, a black spot or a white spot can be used as the visible feature. Instead of using the FAST function in OPENCV, the position of the black or white spot may be found by analyzing pixel intensity in ROI 402. This is simply calculated with the function of "minMaxLoc". cv::minMaxLoc(ROI, &min, &max, &min_loc, &max_loc), where min_loc is used if the visible feature is darker (black spot) than the area around it around it, while max_loc is used if the visible feature is brighter (white spot) than the area around it around it.

After the visible feature is identified in the second captured image, the controller 108 determines if the second component 104 is in the predetermined position relative to the first component 102 based on the second captured image and the identified visible feature of the second component 104 within the ROI 402 of the first captured image. In some embodiments, the controller 108 determines second coordinates of the identified visible feature of the second component in the second captured image. The second coordinates are X-Y coordinates of the location of the visible feature in the second captured image. If the second component 104 is properly in the predetermined position, the second coordinates should match the first coordinates determined from the first captured image. Thus, the controller 108 is configured to determine if the second component 104 is in the predetermined position relative to the first component 102 by comparison of the second coordinates to the first coordinates.

In some embodiments, the second component 104 is determined to be in the predetermined position relative to the first component 102 when the second coordinates are the same as the first coordinates. Alternatively, the second component 104 may be determined to be in the predetermined position relative to the first component 102 when the second coordinates are within a threshold distance of the first coordinates. The threshold distance may be selected to account for possible slight variations in the images or the detection of the visible feature, or to allow for a certain amount of acceptable variation in the positioning of the second component 104.

When the controller 108 determines that the second component 104 is expected to be in the predetermined position but it is not, the controller 108 may generate an alarm. That is when the controller 108 determines that the second component 104 is expected to be in the predetermined position, but the visible feature in the second captured image does not have second coordinates equal to (or within a threshold distance of) the first coordinates, the controller 108 generates an alarm. The alarm may be a human cognizable alarm, such as a flashing light or siren, a computer cognizable alarm, such as an alarm message sent to a system controller, or both. In response to the alarm, a user may adjust or repair the second component 104 as needed to return the second component 104 to the proper alignment relative to the first component 102.

Figure 7:
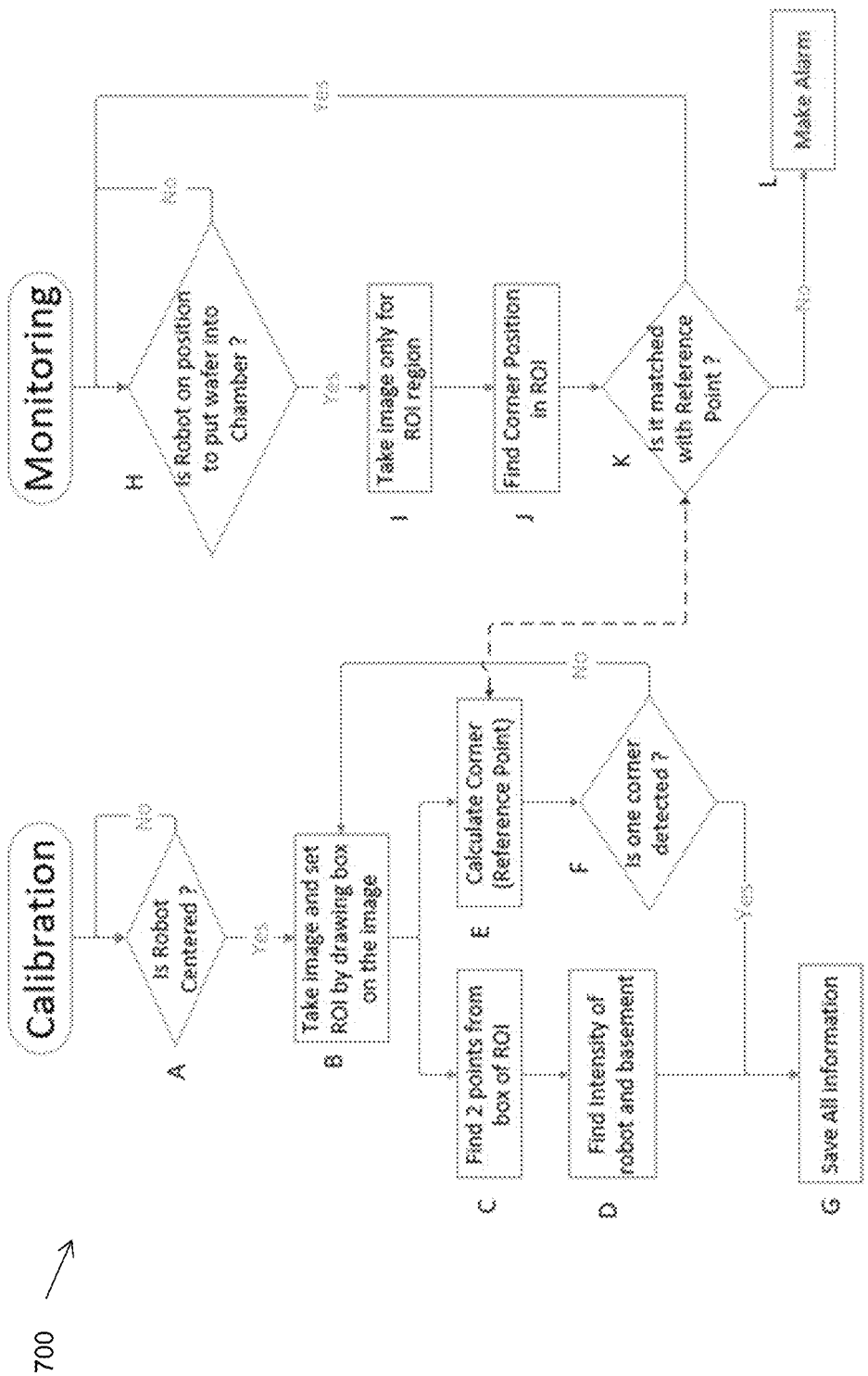
FIG. 7 is a flowchart of an example method for monitoring alignment of a second component relative to a first component.

FIG. 7 is a flowchart of an example method 700 for monitoring alignment of a second component relative to a first component. The method may be performed by system 100 and its components, or may be used with any other suitable system or components.

Any logic flows depicted in the figures do not require the particular order shown, or sequential order, to achieve desirable results. In addition, other steps may be provided, or steps may be eliminated, from the described flows, and other components may be added to, or removed from, the described systems. Accordingly, other embodiments are within the scope of the following claims.

It will be appreciated that the above embodiments that have been described in particular detail are merely example or possible embodiments, and that there are many other combinations, additions, or alternatives that may be included.

Also, the particular naming of the components, capitalization of terms, the attributes, data structures, or any other programming or structural aspect is not mandatory or significant, and the mechanisms that implement the disclosure or its features may have different names, formats, or protocols. Further, the system may be implemented via a combination of hardware and software, as described, or entirely in hardware elements. Also, the particular division of functionality between the various system components described herein is merely one example, and not mandatory; functions performed by a single system component may instead be performed by multiple components, and functions performed by multiple components may instead performed by a single component.

Approximating language, as used herein throughout the specification and claims, may be applied to modify any quantitative representation that could permissibly vary without resulting in a change in the basic function to which it is related. Accordingly, a value modified by a term or terms, such as "about" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

Various changes, modifications, and alterations in the teachings of the present disclosure may be contemplated by those skilled in the art without departing from the intended spirit and scope thereof. It is intended that the present disclosure encompass such changes and modifications.

This written description uses examples to describe the disclosure, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A system for monitoring alignment of a second component relative to a first component, the system comprising:
   a camera positioned in fixed relationship to the first component and operable to capture images of the first component and the second component during an operation of the second component;
   a controller including a processor and a non-transitory memory storing instructions executed by the processor to configure the controller, the controller configured to:
   receive a first captured image from the camera when the second component is in a predetermined position relative to the first component;
   receive a selection of a region of interest (ROI) in the first captured image including at least a portion of the first component and at least a portion of the second component;
   identify a visible feature of the second component within the ROI of the first captured image;
   receive captured images from the camera during a subsequent operation;
   identify a second captured image from the received captured images during the subsequent operation when the second component is expected to be in the predetermined position relative to the first component; and
   determine if the second component is in the predetermined position relative to the first component based on the second captured image and the identified visible feature of the second component within the ROI of the first captured image.

2. The system of claim 1, wherein the second component comprises a robotic arm moveable relative to the first component.

3. The system of claim 2, wherein the first component comprises a wafer chamber, and the robotic arm is configured to place a semiconductor wafer in the wafer chamber during the operation and the subsequent operation.

4. The system of claim 1, wherein the controller is further configured to:
   determine first coordinates of the identified visible feature of the second component within the ROI of the first captured image;
   store the first coordinates in the memory;
   identify the visible feature of the second component in the second captured image; and
   determine second coordinates of the identified visible feature of the second component in the second captured image, wherein the controller is configured to determine if the second component is in the predetermined position relative to the first component by comparison of the second coordinates to the first coordinates.

5. The system of claim 4, wherein the controller is configured to determine that the second component is in the predetermined position relative to the first component when the second coordinates equal the first coordinates.

6. The system of claim 4, wherein the controller is configured to determine that the second component is in the predetermined position relative to the first component when the second coordinates are within predetermined threshold distances from the first coordinates.

7. The system of claim 4, wherein the controller is configured to identify the visible feature of the second component in the first captured image and the second captured image based on intensity values of pixels within the first captured image and the second captured image.

8. The system of claim 4, wherein the controller is further configured to generate an alarm when the controller determines that the second component is not in the predetermined position relative to the first component.

9. The system of claim 4, wherein the controller is configured to determine if the second component is in the predetermined position relative to the first component during a predetermined step of the operation.

10. The system of claim 9, wherein the controller is further configured to determine that the operation is at the predetermined step based on intensity values in the captured images during the subsequent operation.

11. A method for monitoring alignment of a second component relative to a first component comprising:
   capturing a first captured image when the second component is in a predetermined position relative to the first component using a camera positioned in fixed relationship to the first component and operable to capture images of the first component and the second component during an operation of the second component;
   receiving a selection of a region of interest (ROI) in the first captured image including at least a portion of the first component and at least a portion of the second component;
   identifying a visible feature of the second component within the ROI of the first captured image;

receiving captured images from the camera during a subsequent operation;

identifying a second captured image from the received captured images during the subsequent operation when the second component is expected to be in the predetermined position relative to the first component; and determining if the second component is in the predetermined position relative to the first component based on the second captured image and the identified visible feature of the second component within the ROI of the first captured image.

12. The method of claim 11, wherein the second component comprises a robotic arm moveable relative to the first component.

13. The method of claim 12, wherein the first component comprises a wafer chamber, and the robotic arm is configured to place a semiconductor wafer in the wafer chamber during the operation and the subsequent operation.

14. The method of claim 11, further comprising:
determining first coordinates of the identified visible feature of the second component within the ROI of the first captured image;
storing the first coordinates in a memory;
identifying the visible feature of the second component in the second captured image; and
determining second coordinates of the identified visible feature of the second component in the second captured image, wherein determining if the second component is in the predetermined position relative to the first component comprises determining if the second component is in the predetermined position relative to the first component by comparison of the second coordinates to the first coordinates.

15. The method of claim 14, wherein determining if the second component is in the predetermined position relative to the first component comprises determining that the second component is in the predetermined position relative to the first component when the second coordinates equal the first coordinates.

16. The method of claim 14, wherein determining if the second component is in the predetermined position relative to the first component comprises determining that the second component is in the predetermined position relative to the first component when the second coordinates are within predetermined threshold distances from the first coordinates.

17. The method of claim 14, wherein:
identifying the visible feature of the second component in the first captured image comprises identifying the visible feature based on intensity values of pixels within the first captured image; and
identifying the visible feature of the second component in the second captured image comprises identifying the visible feature based on intensity values of pixels within the second captured image.

18. The method of claim 14, further comprising generating an alarm when the second component is determined not to be in the predetermined position relative to the first component.

19. The method of claim 14, wherein determining if the second component is in the predetermined position relative to the first component is performed during a predetermined step of the operation.

20. The method of claim 19, further comprising determining that the operation is at the predetermined step based on intensity values in the captured images during the subsequent operation.

* * * * *